United States Patent
Phan et al.

(10) Patent No.: US 7,242,600 B2
(45) Date of Patent: Jul. 10, 2007

(54) CIRCUIT AND METHOD FOR SUBDIVIDING A CAMRAM BANK BY CONTROLLING A VIRTUAL GROUND

(75) Inventors: Michael ThaiThanh Phan, Cary, NC (US); Chiaming Chai, Chapel Hill, NC (US); Jeffrey Todd Bridges, Raleigh, NC (US); Jeffrey Herbert Fischer, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/262,062

(22) Filed: Oct. 28, 2005

(65) Prior Publication Data

US 2007/0097722 A1    May 3, 2007

(51) Int. Cl.
*G11C 15/00* (2006.01)
(52) U.S. Cl. .............. 365/49; 365/203; 365/230.03
(58) Field of Classification Search ............ 365/49, 365/203, 230.03
See application file for complete search history.

(56) References Cited

U.S. PATENT DOCUMENTS

| | | | |
|---|---|---|---|
| 6,700,827 B2 * | 3/2004 | Lien et al. .............. | 365/222 |
| 7,019,999 B1 * | 3/2006 | Srinivasan et al. ......... | 365/49 |
| 7,050,318 B1 * | 5/2006 | Argyres .................. | 365/49 |
| 7,110,317 B2 * | 9/2006 | Song et al. .............. | 365/226 |

* cited by examiner

Primary Examiner—Hoai V. Ho
(74) Attorney, Agent, or Firm—Nicholas J. Pauley; Thomas Rouse; John L. Ciccozzi

(57) ABSTRACT

A CAM bank is functionally divided into two or more sub-banks, without replicating CAM driver circuits, by disabling all match line discharge circuits in the bank, and selectively enabling the discharge circuits in entries comprising sub-banks. At least one selectively actuated switching circuit is interposed between the virtual ground node of each discharging comparator in the discharge circuit of a sub-bank and circuit ground. When the switching circuit is in a non-conductive state, the virtual ground node is maintained at a voltage level sufficiently above circuit ground to preclude discharging a connected match line within the CAM access time. When the switching circuit is placed in a conductive state, the virtual ground node is pulled to circuit ground and the connected match line may be discharged by a miscompare. Control signals, which may be decoded from address bits, are distributed to the switching circuits to define the CAM sub-banks.

21 Claims, 6 Drawing Sheets

CIRCUIT AND METHOD FOR SUBDIVIDING A CAMRAM BANK BY CONTROLLING A VIRTUAL GROUND

BACKGROUND

The present invention relates generally to the field of digital electronics and in particular to a circuit and method for subdividing a CAMRAM bank via a virtual ground.

Microprocessors perform computational tasks in a wide variety of applications, including embedded applications such as portable electronic devices. The ever-increasing feature set and enhanced functionality of such devices requires ever more computationally powerful processors, to provide additional functionality via software. Another trend of portable electronic devices is an ever-shrinking form factor. A major impact of this trend is the decreasing size of batteries used to power the processor and other electronics in the device, making power efficiency an increasingly important design consideration. Hence, processor improvements that increase execution speed and reduce power consumption are desirable for portable electronic device processors in particular as well as processors in general.

Most modern processors capitalize on the spatial and temporal locality properties of most programs by storing recently executed instructions and recently accessed data in one or more cache memories for ready access by an instruction execution pipeline. A cache is a high-speed, usually on-chip, memory structure comprising a Content Addressable Memory (CAM) and corresponding Random Access Memory (RAM), known as a CAMRAM. The instructions or data reside in a cache "line" stored in the RAM. To determine whether a particular datum resides in the RAM, a portion of its address is applied to the CAM.

A CAM is a particular memory structure wherein an applied compare input (referred to herein as the key) is simultaneously compared to data stored in each CAM entry (referred to herein as a key field), and the output of the CAM is an indication of which, if any, key field matches the key. In a cache, the key and key fields are portions of (virtual or physical) addresses, and if a match occurs (i.e., the access "hits" in the cache), the location of the match indexes the RAM, and the corresponding cache line is accessed.

The CAMRAM circuit may also be employed in a Translation Lookaside Buffer (TLB) for fast address translation. In this application, an applied virtual address is the key, previously translated virtual addresses are stored as key fields in the CAM, and associated RAM locations store corresponding physical addresses. CAMRAMs may also be deployed in other applications, such as a memory board that queues write requests. In this case, the address of a read request may be a key, searching against queued write addresses. A hit indicates write data more recent than that stored in the memory, which must be used to service the read request to ensure coherency. In general, CAMRAMs are useful in a variety of applications.

FIG. 1 depicts a functional block diagram of a portion of one entry of a CAM structure, indicated generally by the numeral 100. The CAM entry j includes a match line 102 that spans all bit positions of the $j^{th}$ key field 110. The match line 102 is pulled high by a PRECHARGE signal turning on the gate of a pass transistor 104 connecting the match line 102 to power. At each bit of the $j^{th}$ CAM entry, a discharge circuit 105 may selectively discharge the match line 102. FIG. 1 depicts a functional block diagram of the discharge circuit 105, including a switching circuit 106 such as a pass transistor interposed between the match line 102 and circuit ground. The gate of the discharge transistor 106 is the logical XOR 108 of a key bit 112 and the corresponding key field bit 110. At each $i^{th}$ bit position, if the key bit 112 and the key field bit 110 match, the output of the XOR gate 108 is low and the transistor 106 does not conduct charge from the match line 102 to ground. If the key bit 112 and the key field bit 110 mismatch, the output of the XOR gate 108 is high, turning on the transistor 106 and pulling the match line 102 low.

In this manner, if any bit of the key 112 mismatches with any corresponding bit of the key field 110, the match line 102 is pulled low. Conversely, only if every bit of the key 112 and the key field 110 match is no path to ground established, and the match line 102 remains high. A sense circuit 114 detects the level of the $j^{th}$ match line 102 at a time determined by the worst-case match line 102 discharge time. If each key field 110 is unique, which is the case in normal cache and TLB operation, then only one key field 110 should match the key 112. In that case, only one match line 102 within the CAM will remain high. To ensure this is the case, the output of each match line sense circuit 114 goes to a collision detection circuit 116, which detects multiple matches, and generates an error if they occur.

A high performance processor may include large cache memories, for example, having 512 entries or more. Comparing a key 112 to all 512 entries presents several problems. Capacitive loading due to large fan-out, such as in distributing the key bits 112 to all CAM entries 100 reduces the speed of operation. Additionally, precharging and discharging at least 511 match lines 102 for each access consumes excessive power. To address these concerns, the CAMRAM of a large cache may be divided into banks, as shown in FIG. 2 (depicting four banks, although any number of banks may be implemented in any given application).

A CAMRAM 120 comprises a plurality of CAM banks 122, and a corresponding plurality of RAM banks 124. In the case of a cache, the banks may be selected by decoding predetermined address bits. Each CAM bank comprises a set of CAM driver circuits 126 that buffer and distribute signals to the CAM entries 100 within the CAM bank 122. The CAM driver circuits 126 may include "overhead" circuits such as clock drivers, write drivers and control signals for the key field memory cells 110, sense amps and buffers for reading the key field memory cells 110, and the like (not shown). One component of the CAM driver circuits 126, depicted in FIG. 2, are key drivers 127 for distributing the key bits 112 to CAM entries 100 within each CAM bank 122. In this example, the key drivers 127 comprise AND gates that gate the key bits 112 with a CAM clock signal.

A CAM bank 122 may include, for example, 64 CAM entries 100. In general, higher performance and lower power consumption may be achieved by reducing the number of CAM entries 100 per CAM block 122. However, this requires a larger number of CAM banks 122, replicating the CAM driver circuits 126, which wastes silicon area. Thus, a means for functionally subdividing a CAM bank 122 to activate fewer CAM entries 100 at a time, while not replicating the CAM driver circuits 126, would be advantageous.

SUMMARY

A CAM bank is functionally divided into two or more sub-banks, without replicating CAM driver circuits, by disabling all match line discharge circuits in the bank, and selectively enabling the discharge circuits in entries comprising sub-banks. At least one selectively actuated switching circuit is interposed between the virtual ground node of each discharging comparator in the discharge circuit of a sub-bank and circuit ground. When the switching circuit is in a non-conductive state, the virtual ground node is maintained at a voltage level sufficiently above circuit ground to preclude discharging a connected match line within the CAM access time. When the switching circuit is placed in a conductive state, the virtual ground node is pulled to circuit ground and the connected match line may be discharged by a miscompare. Control signals, which may be decoded from address bits, are distributed to the switching circuits to define the CAM sub-banks.

One embodiment relates to a method of subdividing a CAM bank including driver circuits and a plurality of CAM entries less than the number of entries in the CAM. Discharge circuits connected to match lines in each CAM entry in the bank are disabled by raising a virtual ground of each discharge circuit above circuit ground. A plurality of the CAM entries less than the number of entries in the bank are selectively enabled by pulling the virtual ground of each discharge circuit in the selected entries to circuit ground.

Another embodiment relates to a banked CAM, including CAM driver circuits and a plurality of CAM entries. Each CAM entry includes a plurality of discharge circuits. Each discharge circuit includes a memory cell storing a key field bit. The banked CAM includes a memory cell storing a key field bit, and a comparator connected to a CAM entry match line and operative to compare an applied key bit to the key field bit in the memory cell, and further operative to discharge the match line to a virtual ground node if the key bit and key field bit miscompare. The banked CAM further includes two or more selectively actuated switching circuits, each interposed between the virtual ground node of one or more comparators and circuit ground. Each is switching circuit operative in an open state to inhibit the discharge of one or more associated match lines by maintaining the virtual ground node of connected comparators at a voltage level above circuit ground, and operative in a closed state to allow discharge of the match lines by pulling the virtual ground nodes to circuit ground.

Another embodiment relates to a processor, including an instruction execution unit and a memory controller. The processor also includes a banked cache memory including a banked CAMRAM. Each CAM bank includes a plurality of CAM entries and CAM driver circuits. At least one CAM bank is further functionally divided into a plurality of sub-banks, without replication of the CAM driver circuits, by disabling all match line discharge circuits in each CAM entry in the bank, and selectively enabling match line discharge circuits in a plurality of CAM entries less than the total number of CAM entries in the CAM bank.

DETAILED DESCRIPTION

Figure 1:
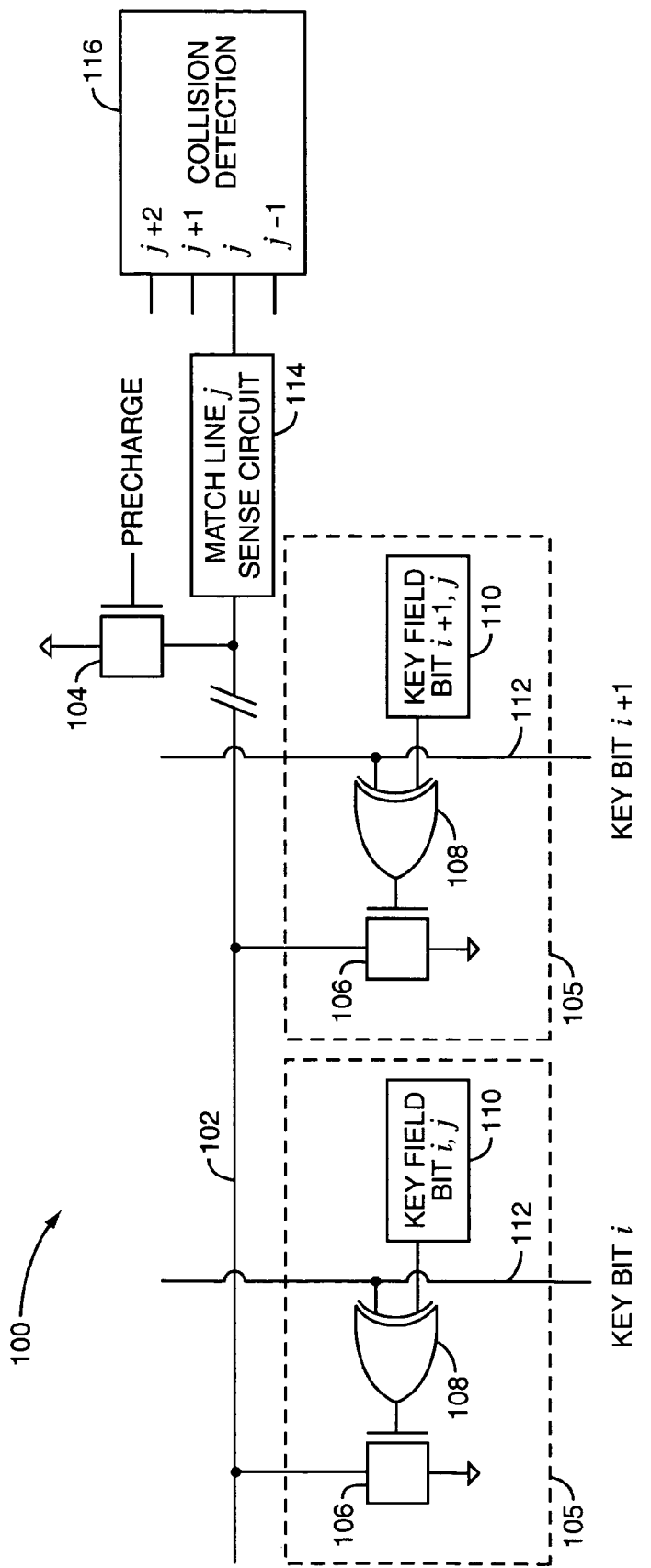
FIG. 1 is a functional block diagram of a CAM entry.
Figure 2:
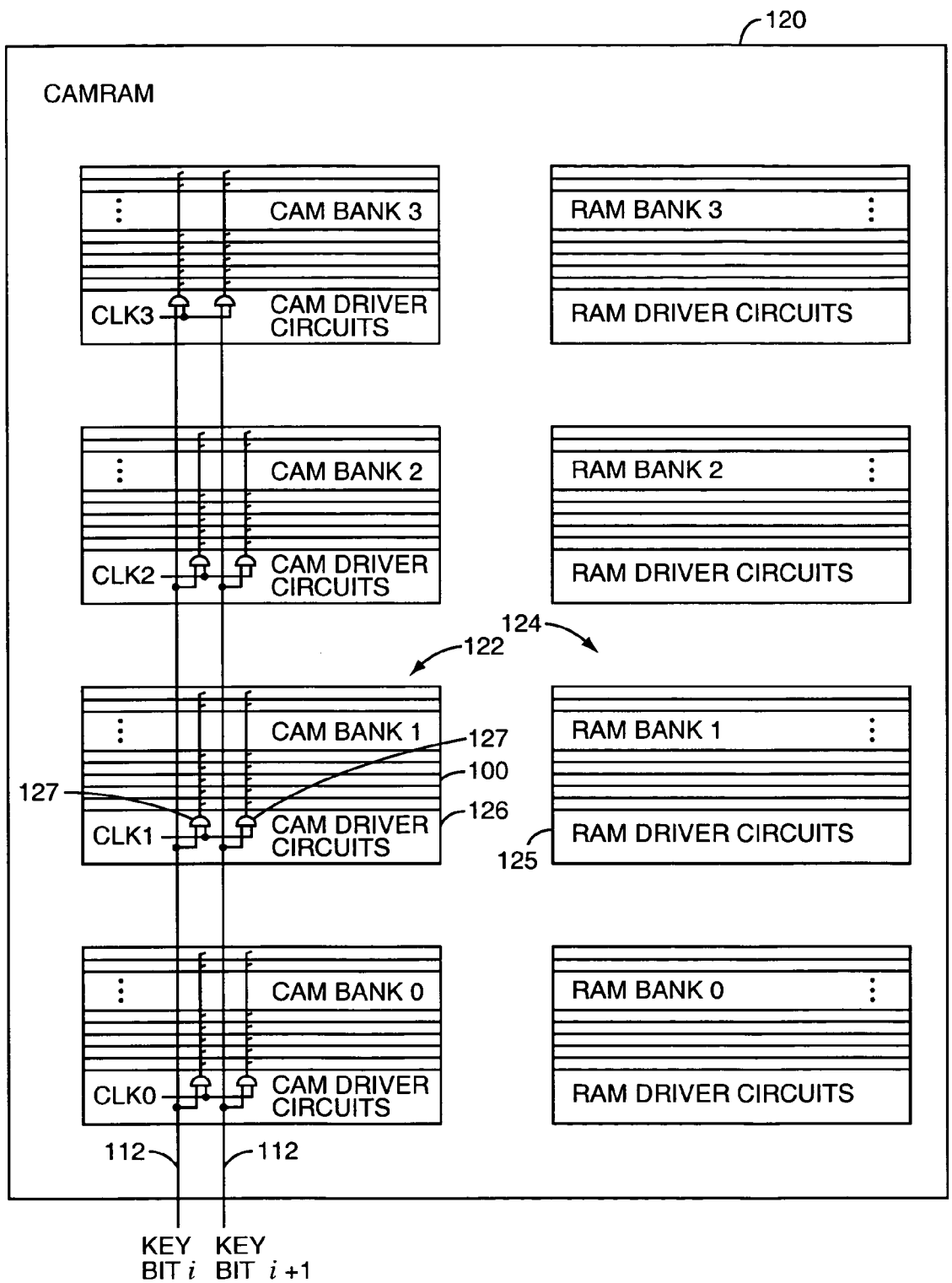
FIG. 2 is a block diagram of a banked CAMRAM.

According to one or more embodiments, a CAM bank 122 is subdivided into two or more sub-banks that share the CAM driver circuits 126. All discharge circuits 105 in the CAM bank 122 are disabled by raising the ground voltage level into which the circuit 105 discharges, from circuit ground to a voltage level above ground sufficient to prevent discharge of the match line 102. This elevated voltage level is referred to herein as a virtual ground. A selected plurality of the CAM entries 100 in the CAM bank 122 may then be enabled by pulling the virtual ground of the discharge circuits 105 in the selected CAM entries 100 to circuit ground. The selected entries are then operative, and form an effective sub-bank of CAM entries 100. In this manner, a CAM block 122 may be subdivided without replicating the CAM driver circuits 126.

Figure 3:
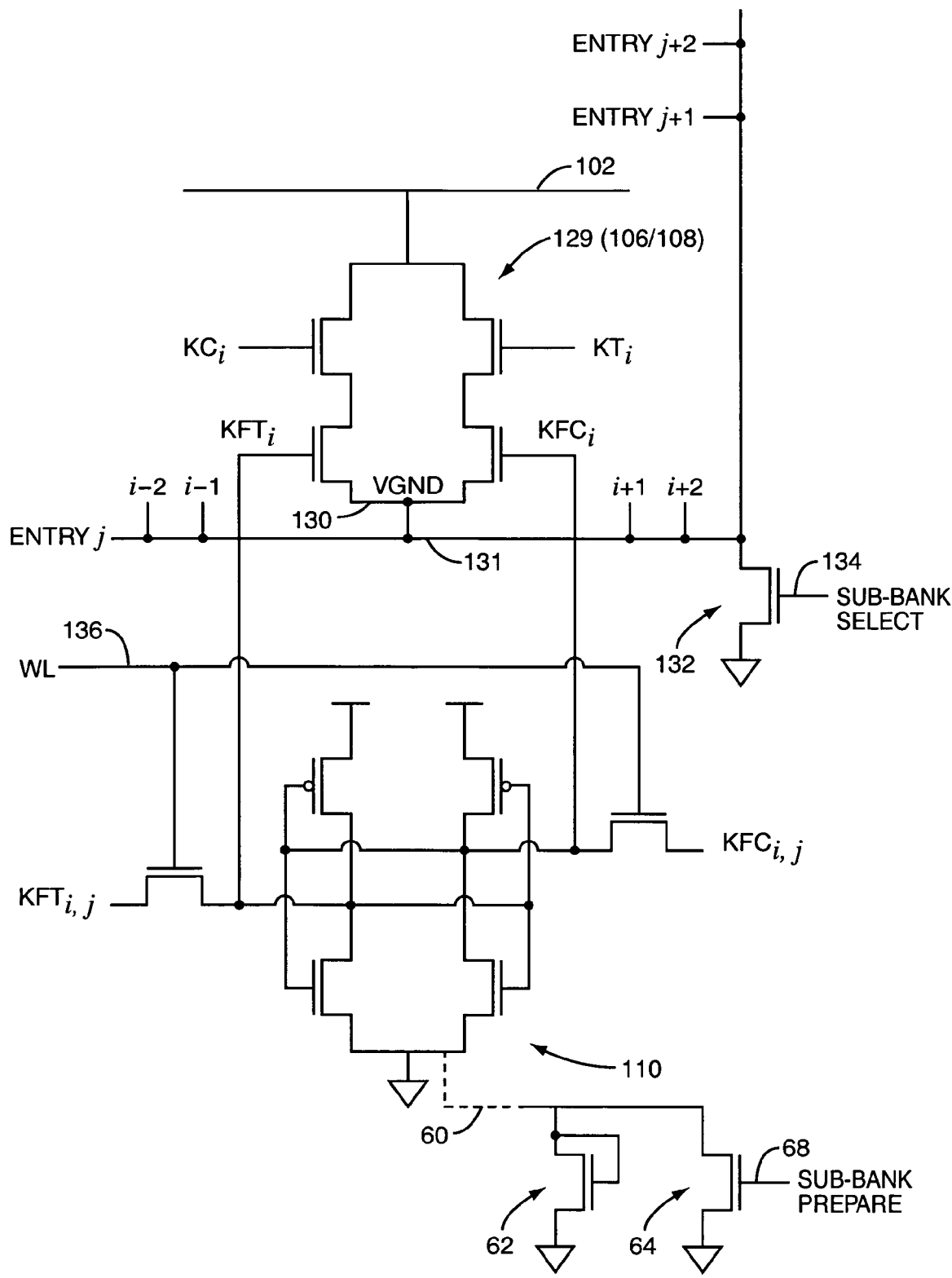
FIG. 3 is a schematic representation of a CAM match line discharge circuit.

A representative discharge circuit 105 is depicted schematically in FIG. 3, corresponding generally to the dotted-line discharge circuit 105 of FIG. 1, with the addition of two signals: write line (WL) 136 and sub-bank select signal 134. The SRAM cell 110 holds the $i^{th}$ bit of the key field for the $j^{th}$ CAM entry. The SRAM cell 110 is a conventional six-transistor cell, implementing two cross-coupled inverters, with write enable gates for the true and compliment bit values. New values for the key field true ($KFT_{i,j}$) and key field complement ($KFC_{i,j}$) are written to the SRAM cell 110 when the write line (WL) 136 is high.

The SRAM cell 110 outputs the stored value of the key field true ($KFT_i$) and key field compliment ($KFC_i$) to the comparator 129 attached to the match line 102. The comparator 129 implements both the XOR logic 108 and the discharge switch 106 function of FIG. 1 (assuming at this point that the switching circuit 132 is closed, or in a conductive state). Also connected to the comparator 129 are the $i^{th}$ bit of the key true ($KT_i$) and key compliment ($KC_i$).

Note that the opposite sense of the key and key field bits are connected to each leg of the comparator 129. When the key and key field bits match, the true sense of one will mismatch the compliment sense of the other. In this case, one of the stacked transistors in either leg of the comparator 129 will be in a closed or conductive state, and the other will be open or non-conductive, preventing the match line 102 from discharging to circuit ground. On the other hand, in the case of a mismatch between the key and key field bits, the true sense of one matches the compliment of the other, and both transistors of one leg of the comparator 129 will be closed, discharging the match line 102 to circuit ground.

In one or more embodiments, a switching circuit 132 is interposed between a virtual ground (VGND) node 130 of the comparators 129 in a sub-bank and circuit ground. The state of the switching circuit 132 is controlled by a sub-bank select signal 134. In the embodiment depicted, when the sub-bank select signal 134 is high, the switching circuit 132 is in a closed or conductive state, and the comparator 129 operates as described above.

However, when the sub-bank select signal 134 is low, the switching circuit 132 is in an open or non-conductive state, and the comparator 129 sees a ground voltage level of VGND at the node 130. VGND is isolated from circuit ground by the switching circuit 132, and is at a voltage level of the match line 102 (precharged to the supply level) less the voltage drop across the source to drain resistance, in the conductive state, of two transistors. VGND is too high to discharge the match line 102 in the time frame of a CAM access cycle, and thus the corresponding CAM entry 100 is effectively disabled.

A CAM block 122 may be subdivided into sub-banks by decoding additional address bits to generate a plurality of sub-bank select signals 134. Each sub-bank select signal 134 is then routed to the switching circuits 132 of the CAM entries 100 in the corresponding sub-bank. For example, by decoding two additional address bits, a 64-entry CAM block 122 may be subdivided into four, 16-entry sub-banks by generating and distributing four sub-bank select signals 134. When a given address activates one of the sub-banks, only sixteen key fields 110 need to be compared, and only sixteen match lines 102 thresholded to determine if one of them was not discharged, indicating a match. Note that all four sub-banks continue to share the CAM driver circuits 126 of the CAM block 122.

One switching circuit 132, connected to conductor 131, may control the voltage at the VGND node for an entire sub-bank, as depicted in FIG. 3. Alternatively, the match lines 102 of the sub-bank may divided and connected to a plurality of switching circuits 132, as required in any given implementation for speed, loading, and the like. For example, each match line 102 or even each comparator 129 in a match line 102 may be connected to a separate switching circuit 132. Regardless of the number of switching circuits 132 required to selectively enable a sub-bank, the savings in silicon area and power consumption over replicating the CAM driver circuits 126 is significant.

Figure 4:
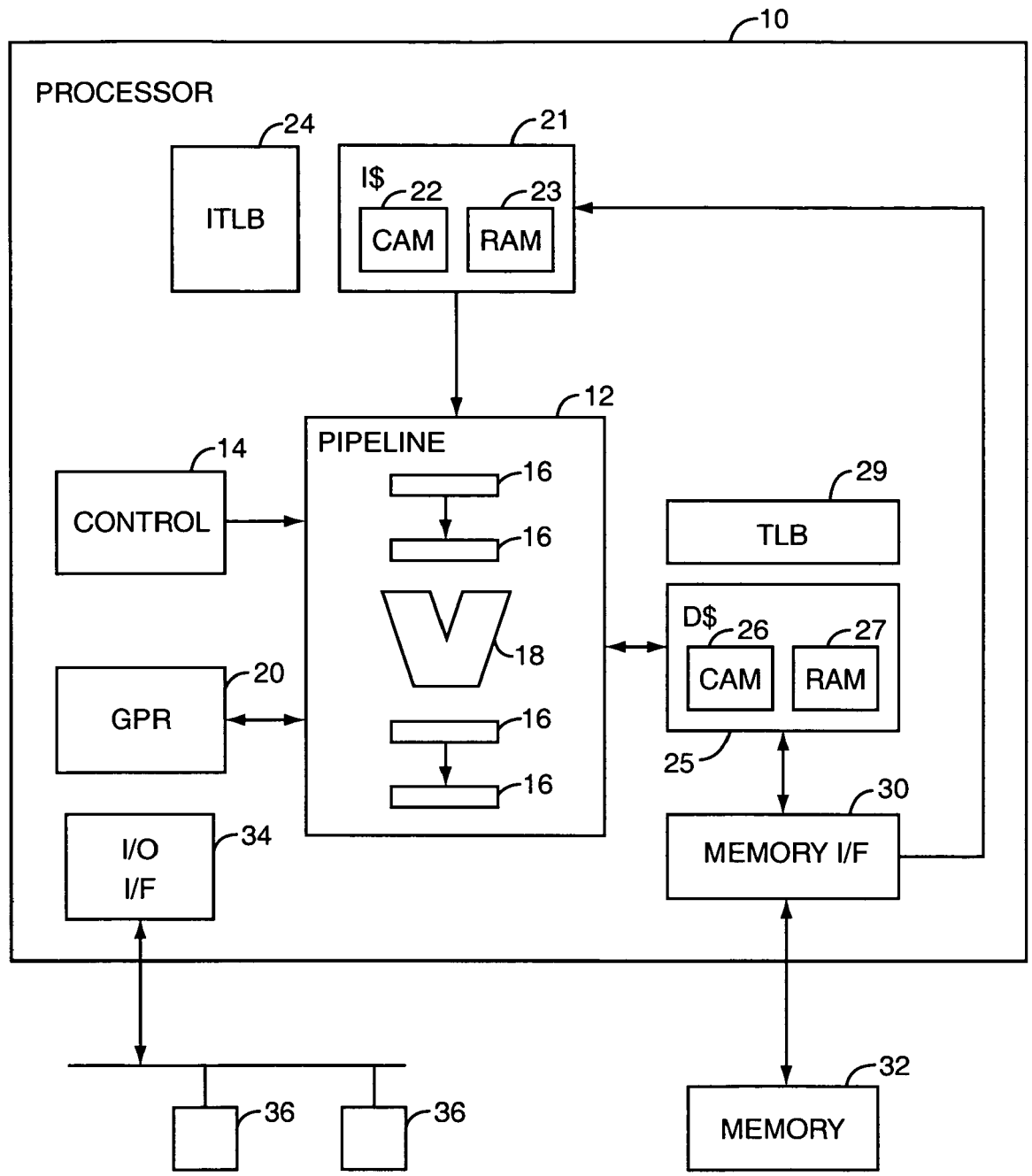
FIG. 4 is a functional block diagram of a processor.

FIG. 4 depicts a functional block diagram of a representative processor 10. The processor 10 executes instructions in an instruction execution pipeline 12 according to control logic 14. The pipeline includes various registers or latches 16, organized in pipe stages, and one or more Arithmetic Logic Units (ALU) 18. A General Purpose Register (GPR) file 20 provides registers comprising the top level of a memory hierarchy.

The pipeline fetches instructions from an Instruction Cache (I-cache) 21, which includes a CAM 22 and RAM 23. Instruction memory addressing and permissions are managed by an Instruction-side Translation Lookaside Buffer (ITLB) 24. Data is accessed from a Data Cache 25, including a CAM 26 and RAM 27. Data memory addressing and permissions are managed by a main TLB 29. In various embodiments, the ITLB 24 may comprise a copy of part of the TLB 29. Alternatively, the ITLB 24 and TLB 29 may be integrated.

In various embodiments of the processor 10, the I-cache 22 and D-cache 26 may be integrated, or unified. Either or both of the I-cache 22 and D-cache 26 may employ banked CAMRAM circuits, wherein the CAM banks 122 may be subdivided by controlling the virtual ground 130 voltage level of match line discharge circuits 105. In this manner, the I-cache 22 and/or D-cache 26 provide improved performance and reduced power consumption, without the area penalty of replicating CAM driver circuits 126.

Misses in the I-cache 22 and/or the D-cache 26 cause an access to main (off-chip) memory 32, under the control of a memory interface 30. The processor 10 may include an Input/Output (I/O) interface 34, controlling access to various peripheral devices 36. Those of skill in the art will recognize that numerous variations of the processor 10 are possible. For example, the processor 10 may include a second-level (L2) cache for either or both the I and D caches 21, 25. In addition, one or more of the functional blocks depicted in the processor 10 may be omitted in a particular embodiment.

Figure 5:
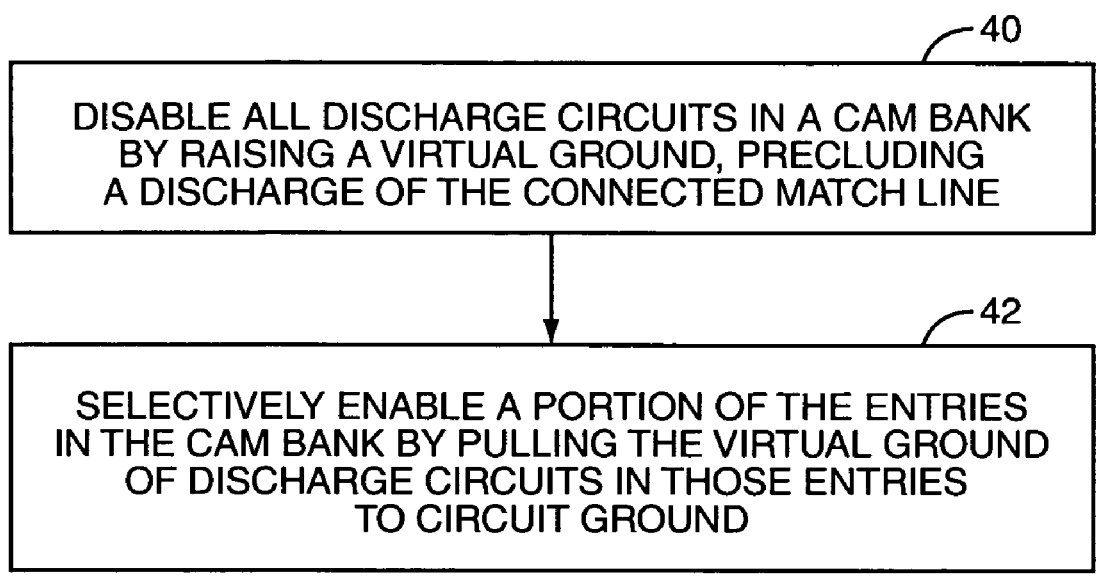
FIG. 5 is a flow diagram of a method of subdividing a CAM bank.

A method of subdividing a CAM bank 122 is depicted in flow diagram form in FIG. 5. All discharge circuits 105 in the CAM bank 122 are disabled by raising the ground voltage level seen by the comparator 129 in the discharge circuit 105 to a virtual ground 130 above the circuit ground voltage level (block 40). This may comprise interposing a switching circuit 132 between the virtual ground node 130 and circuit ground, and placing the switching circuit 132 in a non-conductive state. The elevation of the virtual ground node 130 above circuit ground precludes the discharge of an attached match line 102 in the event of a miscompare between bits of the key 112 and key field 110.

A portion of the CAM entries 100 in the CAM bank 122—i.e., a sub-bank—may be selectively enabled by pulling the virtual ground node 130 of the comparators 129 of the discharge circuits 105 in the selected CAM entries 100 to circuit ground (block 42). This may comprise placing the switching circuit 132 in a conductive state, pulling the virtual ground node 132 to circuit ground and allowing an attached match line 102 to discharge to circuit ground when any key bit 112 and key field bit 110 in the CAM entry 100 mismatch. The sub-bank may be defined by decoding address bits in addition to the address bits that are decoded to define CAM banks 122. This further enhances performance by reducing the number of key field bits 110 in each CAM entry 100.

Figure 6:
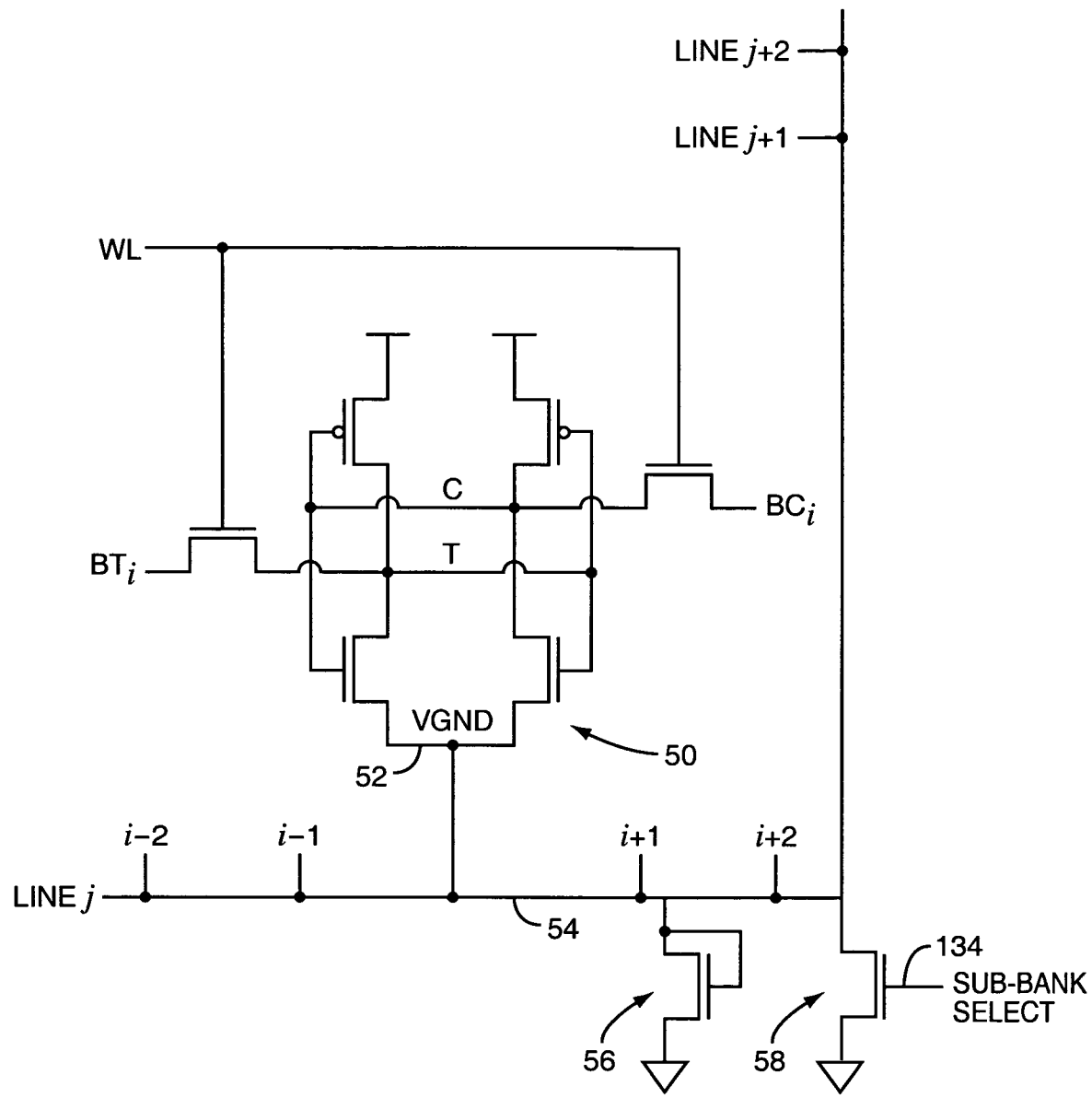
FIG. 6 is a schematic representation of a RAM cell having a reduced leakage current mode.

In one embodiment, the sub-bank select signals that subdivide a CAM bank 122 may additionally be utilized to reduce leakage current in the RAM banks 124 by source biasing the RAM cells. FIG. 6 depicts an SRAM cell 50 with a virtual ground (VGND) node 52 isolated from circuit ground by a switching circuit 58, which may for example comprise a transistor. Otherwise, the RAM cell 50 is a conventional six-transistor memory cell implementing a pair of cross-coupled inverters, as described above with respect to the CAM key field memory cell 110 (FIG. 3). Also interposed between the VGND node 52 and circuit ground, in parallel with the switching circuit 58, is a diode 56.

When reading or writing the RAM cell 50, the VGND node 52 is pulled to circuit ground by placing the switching circuit 54 in a conductive state by asserting the sub-bank select signal 134. When the corresponding CAM entry 100 is in a non-selected (and hence, disabled) CAM sub-bank, the sub-bank select signal 134 is deasserted, and the VGND node 52 is isolated from circuit ground. In this case, the diode 56 ensures that the VGND node 52 is maintained at a predetermined level above circuit ground, which may for example be in the range of 200–300 mV. This ensures that the RAM cell 50 will retain its stored data value; however, leakage currents in the RAM cell 50 are reduced, thus reducing power consumption by the CAMRAM 120.

FIG. 6 depicts a single diode 56 and switching circuit 58 interposed between the VGND node 52 and circuit ground for all RAM cells 50 in a sub-bank, connected by conductor 54. In a given implementation, a subset of RAM lines may be grouped and connected to separate diodes 56 and switching circuits 58. For example, each RAM line or even each RAM cell 50 may be connected to a separate diode 56 and switching circuit 58. All of the diodes 56 and switching circuits 58 are controlled by the sub-bank select signal 134.

When the corresponding CAM sub-bank is selected and the sub-bank select signal 134 is asserted, the switching circuit 58 is placed in a conductive state, pulling the VGND node 52 to circuit ground. The RAM cell 50 requires some transient period to stabilize with its ground at circuit ground. This may occur during the CAM access period, i.e., during the time required to compare the key 112 and key field 110 bits for each CAM entry 100 in the selected sub-bank, discharge all but (at most) one match line 102, threshold the match lines 102, perform collision detection, and index the RAM entry associated with the matching CAM entry 100. In the event that the RAM cell 50 requires more time to stabilize than the CAM entry 100 access time, wait cycles may be inserted by cache control circuits (which may, for example, reside in the RAM driver circuits 125). This trade-off of speed for reduced power consumption may be particularly attractive for processors deployed in portable electronic devices, where efficient use of limited battery power is paramount.

Referring to FIG. 3, in one embodiment, source biasing may be used with the CAM key field memory cells 110 to reduce leakage currents. In this embodiment, instead of the ground connection of the memory cell 110, the VGND node is connected by line 60 to a diode 62 and switching circuit 68, that are connected to circuit ground. The CAM memory cell 110 operates as described above with respect to the RAM cell 50. By placing the switching circuit 58 in a non-conductive state, leakage currents in the CAM memory cell 100 are reduced, as it sees a ground voltage elevated from circuit ground by the diode 56 (e.g., 200–300 mV). The diode 62 and switching circuit 64 are depicted as connected to only one memory cell 110 in FIG. 3 for simplicity; in any given implementation, a single diode 62 and switching circuit 64 may be connected by conductor 60 to a plurality of, or to all of, the memory cells 110 in a CAM sub-bank.

The state of the switching circuit 64 is controlled by a sub-bank prepare control signal 68. When the switching circuit 64 is placed in a conductive state, the CAM memory cell 110 requires some transient time to settle with its VGND node at circuit ground. The sub-bank prepare signal 68 may be the same as the sub-bank select signal 134. In this case, the settling time of the memory cell 100 will reduce the operating speed of the CAMRAM 120.

In one embodiment, the sub-bank prepare signal 68 that controls the state of the switching circuit 68 may be different than the sub-bank select signal 134. For example, the memory cells 110 of a sub-bank may be prepared by pulling their VGND nodes to circuit ground prior to decoding an address, and hence prior to generating a sub-bank select signal, by predicting the sub-bank to be selected (for example, by always preparing the memory cells 110 of the last sub-bank selected).

In general, source biasing the CAM memory cells 110 of a sub-bank will have a greater performance penalty than source biasing the RAM cells 50, since the transient preparation time required to pull the VGND node to circuit ground for the CAM memory cells 110 cannot overlap the CAM access time. However, the trade-off of performance for power savings may be attractive in portable electronic device applications, where conserving battery power is a primary design goal.

Although the present invention has been described herein with respect to particular features, aspects and embodiments thereof, it will be apparent that numerous variations, modifications, and other embodiments are possible within the broad scope of the present invention, and accordingly, all variations, modifications and embodiments are to be regarded as being within the scope of the invention. The present embodiments are therefore to be construed in all aspects as illustrative and not restrictive and all changes coming and equivalency range of the appended claims are intended to be embraced therein.

What is claimed is:

1. A method of subdividing a CAM bank including driver circuits and a plurality of CAM entries less than the number of entries in the CAM, comprising:
   decoding one or more bits of an incoming address to be compared in the CAM;
   disabling discharge circuits connected to match lines in each CAM entry in the bank by raising a virtual ground of each discharge circuit above circuit ground;
   selectively enabling a plurality of the CAM entries to form a sub-divided CAM bank by pulling the virtual ground of each discharge circuit in the selected entries to circuit ground in response to the decoded one or more bits of the incoming address; and
   discharging match lines of the sub-divided CAM bank for mismatched comparisons of one or more bits of the incoming address.

2. The method of claim 1 wherein the virtual ground is raised to a voltage level sufficiently high to prevent a discharge circuit from discharging a match line.

3. The method of claim 1 wherein selectively enabling the plurality of CAM entries comprises asserting a control signal connected to the switching circuit in response to the decoded one or more address bits.

4. The method of claim 1 further comprising:
   reducing the leakage current in a RAM bank associated with the CAM bank by raising a virtual ground of each RAM cell above circuit ground; and
   pulling the virtual ground of each RAM cell associated with the selected CAM entries to circuit ground prior to reading or writing the RAM cell.

5. The method of claim 4 wherein the virtual ground of each RAM cell is raised above circuit ground by a predetermined amount.

6. The method of claim 5 wherein the predetermined amount is the voltage drop across a diode interposed between a virtual ground node of each RAM cell and circuit ground.

7. The method of claim 1 further comprising:
   reducing the leakage current in memory cells in each CAM entry in the bank by raising a virtual ground of each memory cell above circuit ground; and
   selectively pulling the virtual ground of each memory cell in a plurality of the CAM entries less than the number of entries in the bank to circuit ground prior to reading or writing the memory cell.

8. The method of claim 7 wherein the virtual ground of each memory cell is raised above circuit ground by a predetermined amount.

9. The method of claim 8 wherein the predetermined amount is the voltage drop across a diode interposed between a virtual ground node of each memory cell and circuit ground.

10. A banked CAM, comprising:
    CAM driver circuits;
    a plurality of CAM entries, each CAM entry including a plurality of discharge circuits comprising:
       a memory cell storing a key field bit; a
       a comparator connected to a CAM entry match line and operative to compare an applied key bit to the key field bit in the memory cell, and further operative to discharge the match line to a virtual ground node if the key bit and key field bit miscompare; and
       two or more selectively actuated switching circuits, each interposed between the virtual ground node of one or more comparators and circuit ground, each switching circuit operative in an open state to inhibit discharge of one or more associated match lines by maintaining the virtual ground node of connected comparators at a voltage level above circuit ground, and operative in a closed state to allow discharge of the match lines by pulling the virtual ground nodes to circuit ground, wherein the switching circuits are selectively actuated by control signals decoded from one or more bits of an address to be applied to the CAM.

11. The CAM of claim 10 wherein a CAM bank is functionally divided into two or more sub-banks by the selective actuation of switching circuits to enable only a subset of CAM entries.

12. The CAM of claim 11 wherein one switching circuit controls the virtual ground of all comparators of a CAM sub-bank.

13. The CAM of claim 11 further comprising a banked RAM, comprising:
RAM driver circuits
a plurality of RAM lines, each including a plurality RAM cells; and
two or more independently selectively actuated switching circuits, each interposed between the virtual ground node of one or more RAM cells and circuit ground, and operative in an open state to reduce leakage currents in the RAM cells by maintaining the virtual ground node at a predetermined voltage level above circuit ground, and operative in a closed state to allow reading and writing of the RAM cells by pulling the virtual ground node to circuit ground.

14. The CAM of claim 13 wherein a RAM bank is functionally divided into two or more sub-banks by the selective actuation of switching circuits to enable reading or writing of only a subset of RAM lines.

15. The CAM of claim 14 wherein the switching circuits are controlled by control signal of the associated CAM entry.

16. The CAM of claim 15 wherein one switching circuit controls the virtual ground of all RAM cells of a RAM sub-bank.

17. A processor, comprising:
an instruction execution unit;
a memory controller; and
a banked cache memory including a banked CAMRAM, each CAM bank including a plurality of CAM entries and CAM driver circuits, at least one CAM bank being further functionally divided into a plurality of sub-banks without replication of the CAM driver circuits by disabling all match line discharge circuits in each CAM entry in the bank, and selectively enabling match line discharge circuits in a plurality of CAM entries less than the total number of CAM entries in the CAM bank, wherein the selectively enabling match line discharge circuits are selectively actuated by control signals decoded from one or more bits of an incoming address to be compared in the CAM.

18. The processor of claim 17 further comprising two or more selectively actuated switching circuits, each interposed between a virtual ground node of each match line discharge circuit in a sub-bank and circuit ground.

19. The processor of claim 17 wherein the banked CAM-RAM further includes at least one RAM bank in which a virtual ground node of all RAM cells is maintained above circuit ground by a predetermined amount to reduce leakage current, and where the RAM bank is functionally divided into a plurality of sub-banks by selectively pulling the virtual ground node of all RAM cells in the sub-bank to circuit ground prior to reading or writing the RAM cells.

20. The processor of claim 19 further comprising at least one selectively actuated switching circuit interposed between the virtual ground node of each RAM cell in a sub-bank and circuit ground.

21. The processor of claim 19 further comprising at least one diode interposed between the virtual ground node of each RAM cell in a bank and circuit ground, the diode determining the RAM cell virtual ground node voltage above circuit ground.

* * * * *